(12) United States Patent
Ahmed et al.

(10) Patent No.: US 7,599,448 B2
(45) Date of Patent: Oct. 6, 2009

(54) MULTI-MODE SELECTABLE MODULATION ARCHITECTURE CALIBRATION AND POWER CONTROL APPARATUS, SYSTEM, AND METHOD FOR RADIO FREQUENCY POWER AMPLIFIER

(75) Inventors: Walid Khairy Mohammed Ahmed, Tinton Falls, NJ (US); Dale Scott Douglas, Atlanta, GA (US)

(73) Assignee: Pine Valley Investments, Inc., Las Vegas, NV (US)

( * ) Notice: Subject to any disclaimer, the term of this patent is extended or adjusted under 35 U.S.C. 154(b) by 576 days.

(21) Appl. No.: 11/347,455

(22) Filed: Feb. 3, 2006

(65) Prior Publication Data

US 2007/0183531 A1     Aug. 9, 2007

(51) Int. Cl.
*H03C 1/52*     (2006.01)

(52) U.S. Cl. ...................................................... 375/300

(58) Field of Classification Search ................. 375/295, 375/296, 297, 300; 330/147, 149, 148, 127, 330/129, 82, 109; 327/156
See application file for complete search history.

(56) References Cited

U.S. PATENT DOCUMENTS

| | | |
|---|---|---|
| 4,630,315 A | 12/1986 | Watkinson |
| 5,524,286 A | 6/1996 | Chiesa et al. |
| 5,598,436 A | 1/1997 | Brajal et al. |
| 5,742,201 A | 4/1998 | Eisenberg et al. |
| 5,952,895 A | 9/1999 | McCune, Jr. et al. |
| 6,043,707 A | 3/2000 | Budnik |
| 6,094,101 A | 7/2000 | Sander et al. |
| 6,101,224 A | 8/2000 | Lindoff et al. |
| 6,140,882 A | 10/2000 | Sander |
| 6,147,553 A | 11/2000 | Kolanek |
| 6,255,912 B1 | 7/2001 | Laub et al. |
| 6,353,359 B1 | 3/2002 | Leizerovich |
| 6,449,465 B1 | 9/2002 | Gailus et al. |

(Continued)

FOREIGN PATENT DOCUMENTS

EP     1 492 229 A1     12/2004

(Continued)

OTHER PUBLICATIONS

Joel L. Dawson and Thomas H. Lee, "Automatic Phase Alignment for a Fully Integrated Cartesian Feedback Power Amplifier System,".

(Continued)

*Primary Examiner*—Chieh M Fan
*Assistant Examiner*—Jaison Joseph
(74) *Attorney, Agent, or Firm*—Allen, Dyer, Doppelt, Milbrath & Gilchrist, P.A.

(57) ABSTRACT

A control input signal to select a modulation architecture. When a first modulation architecture is selected based on the control input signal, a time varying and substantially known baseband bias control signal is applied to a bias input of a power amplification module and a time varying and substantially known baseband modulation envelope signal is applied to an input of the power amplification module. When a second modulation architecture is selected based on the control input signal, the time varying and substantially known baseband modulation envelope signal is applied to the bias input of the power amplification module and the time varying and substantially known baseband bias control signal is applied to the input of the power amplification module.

17 Claims, 3 Drawing Sheets

U.S. PATENT DOCUMENTS

| | | | |
|---|---|---|---|
| 6,628,165 B1 | 9/2003 | Henderson et al. | |
| 6,636,112 B1 | 10/2003 | McCune | |
| 6,693,956 B1 | 2/2004 | Yamamoto | |
| 6,701,134 B1 | 3/2004 | Epperson | |
| 6,834,084 B2 | 12/2004 | Hietala | |
| 6,844,788 B2 | 1/2005 | Chadwick | |
| 6,906,996 B2 * | 6/2005 | Ballantyne | 370/204 |
| 7,180,384 B2 * | 2/2007 | Efstathiou et al. | 332/106 |
| 7,260,369 B2 * | 8/2007 | Feher | 455/133 |
| 2002/0090921 A1 * | 7/2002 | Midtgaard et al. | 455/126 |
| 2002/0193085 A1 | 12/2002 | Mathe et al. | |
| 2002/0196864 A1 * | 12/2002 | Booth et al. | 375/296 |
| 2003/0031267 A1 | 2/2003 | Hietala | |
| 2003/0073419 A1 | 4/2003 | Chadwick | |
| 2003/0215025 A1 | 11/2003 | Hietala | |
| 2003/0215026 A1 | 11/2003 | Hietala | |
| 2003/0216126 A1 * | 11/2003 | Ballantyne | 455/102 |
| 2004/0021517 A1 | 2/2004 | Irvine et al. | |
| 2004/0192369 A1 | 9/2004 | Nilsson | |
| 2004/0198257 A1 | 10/2004 | Takano et al. | |
| 2004/0198270 A1 | 10/2004 | Rozenblit et al. | |
| 2004/0208157 A1 | 10/2004 | Sander et al. | |
| 2004/0212445 A1 | 10/2004 | Haglan | |
| 2004/0219891 A1 | 11/2004 | Hadjichristos | |
| 2004/0247040 A1 | 12/2004 | Dennis et al. | |
| 2004/0263245 A1 | 12/2004 | Winter et al. | |
| 2004/0266359 A1 | 12/2004 | Ahmed | |
| 2005/0017801 A1 | 1/2005 | Bachman, II et al. | |
| 2005/0030104 A1 | 2/2005 | Chen et al. | |
| 2005/0058219 A1 | 3/2005 | Liu | |
| 2005/0064830 A1 | 3/2005 | Grigore | |
| 2005/0110565 A1 | 5/2005 | Robinson | |
| 2005/0110568 A1 | 5/2005 | Robinson et al. | |
| 2005/0118965 A1 | 6/2005 | Tanabe et al. | |
| 2005/0122164 A1 | 6/2005 | Brandt et al. | |
| 2005/0134396 A1 | 6/2005 | Pehlke et al. | |
| 2006/0038710 A1 * | 2/2006 | Staszewski et al. | 341/143 |
| 2006/0261907 A1 * | 11/2006 | Efstathiou et al. | 332/106 |
| 2007/0223625 A1 * | 9/2007 | Rofougaran | 375/302 |

FOREIGN PATENT DOCUMENTS

| | | | |
|---|---|---|---|
| GB | 2 370 435 A | 6/2002 | |

OTHER PUBLICATIONS

IEEE Journal of Solid-State Circuits, Dec. 2003, pp. 2269-2279, vol. 38, No. 12, IEEE, USA.

* cited by examiner form. In contrast, in a Cartesian (e.g., IQ) architecture modulation configuration, the input waveform is separated into an in-phase (I) component and a quadrature (Q) component. In various implementations, IQ modulation provides an efficient way to transfer information, and it also works well with digital formats. An IQ modulator may be employed to create AM, PM, and frequency modulation (FM) signals or components. It may be desirable to incorporate various modulation architectures in a single transmitter device wherein the particular desired modulation transmitter architecture configuration may be selectable based on various criteria.

MULTI-MODE SELECTABLE MODULATION ARCHITECTURE CALIBRATION AND POWER CONTROL APPARATUS, SYSTEM, AND METHOD FOR RADIO FREQUENCY POWER AMPLIFIER

BACKGROUND

Power control and/or modulation feedback techniques in a radio frequency (RF) power amplifier may be implemented with a variety of circuits. These power control and/or modulation feedback circuits include peak detector/sample-and-hold circuits and complex analog circuit loop systems. Many variants of power control and/or modulation feedback techniques have evolved with respect to polar transmitters. In particular, polar transmitters may utilize open loop or closed loop techniques. Open loop implementation may utilize a single control element to control power and amplitude modulation (AM). The open loop systems control the average power during modulation transmission and comprise a sample-and-hold circuit to hold the direct current (DC) power amplifier control voltage while the AM control signal is being introduced. Closed loop polar transmitters continuously monitor and correct modulation quality and forward transmitted power. In general, closed loop implementations include inherently complex analog circuitry. In closed loop systems, the output may be coupled and mixed down to an intermediate frequency (IF). Errors may be corrected using separate amplitude and phase correction loops. Certain conditions, such as imperfect limiting, however, may cause contention for the phase and amplitude correction loops.

Power control and/or modulation feedback techniques in a RF power amplifier also may be implemented with a variety of circuits specifically adapted to the modulation techniques employed. For example, the circuit architecture may be adapted to operate in a polar modulation configuration or may be adapted to operate in a Cartesian modulation configuration, such as, for example, in-phase/quadrature (IQ) modulation configuration. In a polar modulation configuration an input waveform is separated into an amplitude modulation (AM) component and a phase modulation (PM) component. A circuit may be adapted to separate the AM component out of the input waveform and amplify the remaining PM signal. The AM component then may be re-inserted after an amplification stage to restore the modulation back to its original

SUMMARY

In one embodiment, a method comprises receiving a control input signal to select a modulation architecture. When a first modulation architecture is selected based on the control input signal, applying a time varying and substantially known baseband bias control signal to a bias input of a power amplification module and applying a time varying and substantially known baseband modulation envelope signal to an input of the power amplification module. When a second modulation architecture is selected based on the control input signal, applying the time varying and substantially known baseband modulation envelope signal to the bias input of the power amplification module and applying the time varying and substantially known baseband bias control signal to the input of the power amplification module.

In one embodiment, an apparatus comprises a baseband processing module to receive a control input signal to select a modulation architecture. The apparatus comprises a radio frequency (RF) processing module to apply a time varying and substantially known baseband bias control signal to a bias input of a power amplification module and to apply a time varying and substantially known baseband modulation envelope signal to an input of the power amplification module when a first modulation architecture is selected based on the control input signal. The RF processing module to apply the time varying and substantially known baseband modulation envelope signal to the bias input of the power amplification module and to apply the time varying and substantially known baseband bias control signal to the input of the power amplification module when a second modulation architecture is selected based on the control input signal.

In one embodiment, a system comprises an amplifier comprising a bias input, an input, and an output; and a detection module. The detection module comprises a first input coupled to the input of the amplifier to receive a first signal. The first signal exhibiting a time varying and substantially known baseband modulation envelope signal when a first modulation architecture is selected based on a control input signal and the first signal exhibiting time varying and substantially known baseband bias control signal when a second modulation architecture is selected based on the control input signal. The detection module comprises a second input coupled to the output of the amplifier to receive a second signal. A first mixer is coupled to the first and second inputs of the detection module to mix the first and the second signals and to produce a first signal component. A second mixer is coupled to the second input of the detection module to mix the first signal and a third signal and to produce a second signal component. Either one of the first and second signal components represents a phase and an amplitude difference between the first and second signals.

DETAILED DESCRIPTION

Figure 1:
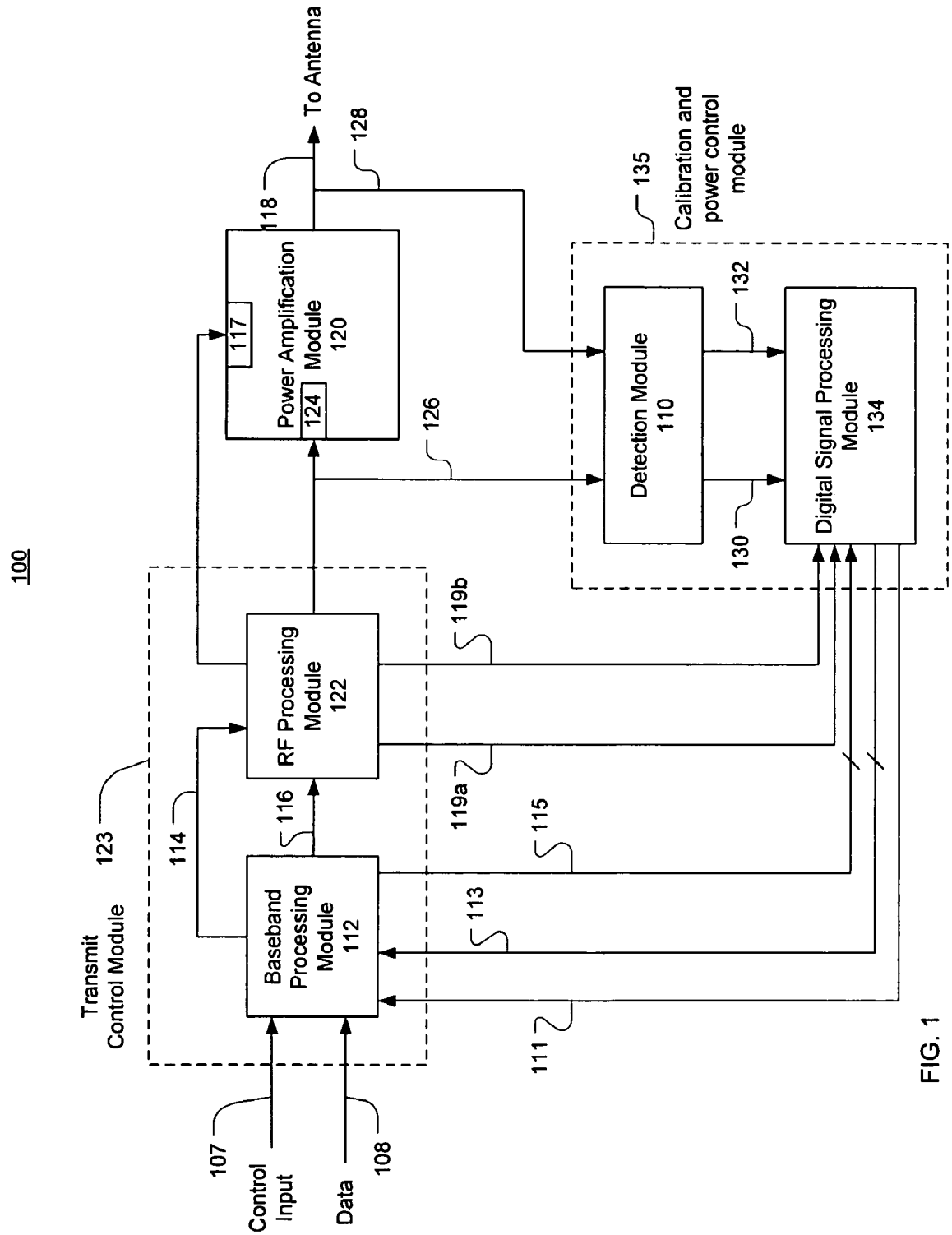
FIG. 1 illustrates a diagram of one embodiment of a transmitter.

Various embodiments described herein provide a transmitter comprising a selectable modulation architecture. The architecture may be dynamically selected based on the desired modulation configuration for the transmitter. The transmitter may comprise a measuring receiver module portion adapted to process signals based on the selected modulation architecture. For example, in one embodiment the measuring receiver module may be configured to process for closed loop Cartesian (e.g., IQ) and/or polar modulation signals based on the particular modulation transmitter architectures selected. In one embodiment, the transmitter may operate in multiple modes. Each mode may be selectable based on various criteria. In one embodiment, the transmitter may comprise a multi-mode selectable input to operate in a plurality of modes based on a modulation technique to be employed in the transmitter. For example, the transmitter may comprise a control input to select either an IQ modulation transmitter architecture or a polar modulation transmitter architecture. Those skilled in the art will appreciate that the control input may comprise single or multiple inputs, may receive controls signals having one or more states, or may be receive serial or parallel digital control signals to select the desired modulation architecture for the transmitter.

In one embodiment, the transmitter receives a baseband signal and may provide a limited amount of RF gain control may be followed by quadrature direct-conversion downmixers. The down conversion may be followed by baseband gain control, DC offset correction, (if necessary), and Analog-to-Digital conversion (if necessary). Therefrom, the signals may be processed using digital processing techniques. Because implementations of digital signal processing techniques may be protocol (e.g., software) dependent, digital processing techniques are not discussed herein. Phase modulation components may be introduced in any suitable manner, such as, for example, in-phase (I) and quadrature (Q) modulators or Sigma-Delta type phase modulators. An input amplitude signal comprising a varying and substantially known envelope may be introduced at an input of a power amplifier in any suitable manner. An output amplitude signal may be provided at an output of the power amplifier. The input and output amplitude signals may be used to generate a feedback signal for the transmitter. The feedback signal may be used to linearize and compensate for phase and amplitude modulation distortions in the transmitter introduced by the power amplifier.

Embodiments of power amplifier detection, calibration, and/or power control techniques described herein may be employed in modulation contexts implemented in IQ and/or polar modulation transmitter architectures, among others, wherein each modulation context may be selectable by way of a control input signal. In one embodiment, a power amplifier output signal may be down converted with a phase modulated signal provided by a phase modulator. In other embodiments, power amplifier detection, calibration, and/or power control may be implemented using a phase modulated signal provided by a Sigma-Delta phase modulator in conjunction with a time varying and substantially known envelope signal. The embodiments are not limited in this context.

FIG. 1 illustrates a diagram of one embodiment of a transmitter. In one embodiment, transmitter 100 may be operated in multiple modes based on a selectable input. For example, in one embodiment, transmitter 100 may comprise a dual-mode selectable control input to receive control input signal 107. Control input signal 107 may be employed to operate transmitter 100 either in a first mode or a second mode based on the desired modulation technique to be employed in transmitter 100. For example, the modulation architecture of transmitter 100 may be selected based on the state of control input signal 107. In one embodiment, control input signal 107 may be employed to select either an IQ or a polar modulation transmitter architecture configuration based on control input signal 107. Those skilled in the art will appreciate that control input signal 107 may comprise single or multiple input signals and/or may be implemented in the form of a serial or parallel digital control word, for example.

In one embodiment, transmitter 100 may comprise transmit control module 123, radio frequency (RF) power amplification module 120, and calibration and power control module 135. Transmit control module 123 comprises baseband processing module 112 coupled to RF processing module 122. Transmit control module 123 receives input data 108 comprising baseband modulation in-phase I(t) and quadrature Q(t) signals, and control input 107 to set the modulation architecture of transmitter 100. In the illustrated embodiment, the operating mode of transmitter 100 may be selected as an IQ or a polar modulation transmitter architecture based on control input signal 107. Power amplification module 120 receives output signals from transmit control module 123. Calibration and power control module 135 comprises detection module 110 and digital signal processing module 134. Calibration and power control module 135 receives signals from power amplification module 120 and transmit control module 123 based on the selected mode of operation of transmitter 100. Detection module 110 receives input signal 126 $S_{PA\ RF\ in}$(t) and input signal 128 $S_{PA\ RF\ out}$(t). In one embodiment, signals 126, 128 may be down-converted. Detection module 110 provides in-phase 132 (I) and quadrature 130 (Q) signals to digital signal processing module 134. In one embodiment, digital signal processing module 134 receives time-varying but substantially known amplitude modulation signal 115 a(t) from baseband processing module 112 as well as time varying and substantially known baseband bias control signal 119a $a_1$(t) for RF power amplification module 120 and time varying and substantially known input gain quantity 119b $a_2$(t) for RF power amplification module 120. Digital signal processing module 134 provides IQ or polar outputs 113 and phase component 111 to baseband processing module 112. The embodiments are not limited in this context.

In one embodiment, detection module 110 may be employed to process signals exhibiting varying phase and time varying and substantially known envelope components. In one embodiment, detection module 110 may provide feedback to baseband processing module 112 by way of feedback loops 111, 113. Baseband processing module 112 receives input data 108 comprising baseband modulation signals I(t) and Q(t) and control input signal 107. In response, baseband processing module 112, produces a time-varying and substantially known amplitude modulation signal 114 a(t), and a time varying or constant phase modulation signal 116 θ(t), which may or may not be substantially known. Phase modulation signal 116 θ(t) is applied to RF processing module 122. RF processing module produces an RF phase modulated signal having a desired phase. The output of RF processing module 122 forms phase modulated signal, which is applied to power amplification module 120.

A time-varying and substantially known amplitude modulation signal 114 a(t) may be defined based on input data 108 comprising baseband modulation signals I(t) and Q(t), as follows:

$$a(t)=\sqrt{I^2(t)+Q^2(t)}$$

A time varying or constant phase modulation signal 116 θ(t), which may or may not be substantially known, may be defined based on input data 108 comprising baseband modulation signals I(t) and Q(t), as follows:

$$\theta(t)=\text{angle}(I(t)+jQ(t))$$

Amplitude modulation control signal 114 a(t) may be applied to a first input of RF processing module 122. Phase modulation control signal 116 θ(t) may be applied to a second input of RF processing module 122. RF processing module 122 may comprise any one of a variety of phase modulator circuits (e.g., Cartesian, Sigma-Delta, and the like). Based on amplitude modulation control signal 114 a(t) and phase modulation control signal 116 θ(t), RF processing module 122 generates a baseband bias signal $S_{PA\ Baseband\ Bias\ in}$(t) and a phase modulated signal $S_{PA\ RF\ in}$(t). Baseband bias signal $S_{PA\ Baseband\ Bias\ in}$(t) may be applied to a bias input 117 of RF power amplification module 120. In one embodiment, RF power amplification module 120 represents a power amplifier chain comprising one or more amplifier stages where each stage may comprise a biasing stage and associated bias input port. Signals applied to bias input 117 regulate the biasing stage of RF power amplifier module 120 to control the gain and output 118 of RF power amplifier module 120 to amplify the signal at input 124 of RF power amplifier module 120 to a level appropriate for transmission from an antenna coupled to output 118. Phase modulated signal $S_{PA\ RF\ in}(t)$ may be applied to an input 124 of RF power amplification module 120, which is applied to the power amplifier chain in accordance with well known techniques. Accordingly, amplified output signal $S_{PA\ RF\ out}(t)$ is produced at output 118 of power amplification module 120 in accordance with well known techniques based on signals applied to input 124 and bias input 117. In one embodiment, baseband bias signal $S_{PA\ Baseband\ Bias\ in}(t)$ may be defined as:

$$S_{PA\ Baseband\ Bias\ in}(t) = a_1(t) + z_{117}(t)$$

where $a_1(t)$ is a time varying and substantially known baseband bias control signal for RF power amplification module 120 and $z_{117}(t)$ is a negligibly small noise error quantity. In one embodiment, phase modulated signal $S_{PA\ RF\ in}(t)$ may be defined as:

$$S_{PA\ RF\ in}(t) = a_2(t) \cdot \cos(2\pi f_c t + \theta(t) + \Psi_o) + z_{124}(t)$$

where $a_2(t)$ is a time varying and substantially known input gain quantity for power amplification module 120 RF, $f_c$ is the carrier frequency, $\theta(t)$ is the phase modulation signal, quantity $\Psi_o$ may or may not be substantially known and is a constant RF phase shift (e.g., due to hardware implementation), and $z_{124}(t)$ is a negligible small noise error quantity.

As previously discussed, transmitter 100 may comprise a dual-mode selectable control input to receive control input signal 107 to select the operation of transmitter 100 in a first IQ modulation architecture operating mode or a second polar modulation architecture operating mode based on the desired modulation architecture for transmitter 100. Baseband bias signal $S_{PA\ Baseband\ Bias\ in}(t)$ and phase modulated signal $S_{PA\ RF\ in}(t)$ may be processed by RF power amplification module 120 according to an IQ or polar modulation transmitter architecture based on control input signal 107. Baseband bias signal $S_{PA\ Baseband\ Bias\ in}(t)$ comprising $a_1(t)$, a time varying and substantially known baseband bias control signal, is applied to bias input 117 of power amplification module 120. Phase modulated signal $S_{PA\ RF\ in}(t)$ comprising $a_2(t)$, a time varying and substantially known input gain quantity, is applied to input 124 of power amplification module 120. Based on control input signal 107, baseband bias signal $S_{PA\ Baseband\ Bias\ in}(t)$ may be either a transmit power control signal or a baseband modulation envelope signal, and phase modulated signal $S_{PA\ RF\ in}(t)$ may a baseband modulation envelope signal or a transmit power control signal, respectively. For example, if based on control input signal 107 a first modulation architecture is selected, then baseband bias control signal $S_{PA\ Baseband\ Bias\ in}(t)$ is a transmit power control signal applied to bias input 117 of amplification module 120 and phase modulated signal $S_{PA\ RF\ in}(t)$ is a baseband modulation envelope signal applied to input 124 of the power amplification module 120. If based on control input signal 107 a second modulation architecture is selected, then baseband bias control signal $S_{PA\ Baseband\ Bias\ in}(t)$ is the baseband modulation envelope signal applied to input 124 of amplification module 120 and phase modulated signal $S_{PA\ RF\ in}(t)$ is the transmit power control signal applied to bias input 117 of power amplification module 120.

In one embodiment, control input signal 107 configures transmitter 100 in a first IQ (in-phase, quadrature) modulation architecture. Accordingly, in this mode baseband bias signal $S_{PA\ Baseband\ Bias\ in}(t)$ (comprising time varying and substantially known baseband bias control signal $a_1(t)$) is a power control input signal applied to bias input 117 of RF power amplification module 120 to control the output power of power amplification module 120 and phase modulated signal $S_{PA\ RF\ in}(t)$ (comprising time varying and substantially known input gain quantity $a_2(t)$) is a modulation input signal applied to input 124 of RF power amplification module 120. In one embodiment, control input signal 107 configures transmitter 100 in a second polar (phase, magnitude) modulation architecture. Accordingly, in this mode baseband bias signal $S_{PA\ Baseband\ Bias\ in}(t)$ is the modulation input signal applied to input 124 of RF power amplification module 120 and phase modulated signal $S_{PA\ RF\ in}(t)$ is the power control input signal applied to bias input 117 of RF power amplification module 120 to control the output power of power amplification module 120.

In one embodiment, RF processing module 122 also may provide signal 119a (e.g., $a_1(t)$) and signal 119b (e.g., $a_2(t)$) to digital signal processing module 134. As previously described, digital signal processing module 134 provides IQ or polar outputs 113 and phase component 111 to baseband processing module 112. The embodiments are not limited in this context.

In response to baseband bias signal $S_{PA\ Baseband\ Bias\ in}(t)$ and phase modulated signal $S_{PA\ RF\ in}(t)$, RF power amplification module 120 produces RF output signal $S_{PA\ RF\ out}(t)$ at an output 118 of power amplification module 120. RF output signal $S_{PA\ RF\ out}(t)$ represents input data 108 comprising in-phase I(t) and quadrature Q(t) baseband modulation signals. RF output signal $S_{PA\ RF\ out}(t)$ may be defined as:

$$S_{PA\ RF\ out}(t) = f(a_1(t), a_2(t)) \cdot \cos(2\pi f_c t + \theta(t) + \phi(a_1(t), a_2(t)) + \Psi_o) + z_{118}(t)$$

where $f(a_1(t), a_2(t))$ is the AM/AM (gain) distortion of RF power amplification module 120, $\phi(a_1(t), a_2(t))$ is the AM/PM (phase) distortion of RF power amplification module 120, $f_c$ is the carrier frequency, $\theta(t)$ is the phase modulation signal, quantity $\Psi_o$ may or may not be substantially known and is a constant RF phase shift (e.g., due to hardware implementation), $a_1(t)$ is the baseband bias control signal, $a_2(t)$ is a time varying and substantially known input gain quantity, and $z_{118}(t)$ is a negligibly small noise error quantity. RF output signal $S_{PA\ RF\ out}(t)$ is a reconstructed amplified version of data input signal 108 and may be coupled to an antenna or other circuit element(s). Power amplification module 120 may comprise an amplifier chain including one or more amplification stages, for example.

In one embodiment, RF output signal $S_{PA\ RF\ out}(t)$ may include distortions caused by power amplification module 120. In addition, RF output signal $S_{PA\ RF\ out}(t)$ includes distortions caused by phase and amplitude modulation, among others. For example, RF output signal $S_{PA\ RF\ out}(t)$ may include AM/AM distortion components defined by $f(a_1(t), a_2(t))$ as well as AM/PM distortion components defined by $\phi(a_1(t), a_2(t))$. AM/AM distortion $f(a_1(t), a_2(t))$ represents the amplitude modulation distortion component of RF output signal $S_{PA\ RF\ out}(t)$ caused by the amplitude modulation process. AM/PM distortion $\phi(a_1(t), a_2(t))$ represents the phase modulation distortion component of RF output signal $S_{PA\ RF\ out}(t)$ caused by the amplitude modulation process.

In the first IQ modulation architecture, phase modulated signal $S_{PA\ RF\ in}(t) = a_2(t) \cdot \cos(2\pi f_c t + \theta(t) + \Psi_o) + z_{124}(t))$ from RF processing module 122 is input reference signal 126 to detection module 110. In the second polar modulation architecture, baseband bias signal $S_{PA\ Baseband\ Bias\ in}(t) = a_1(t) + z_{117}(t)$ from RF processing module 122 is input reference signal 126 to detection module 110. RF output signal $S_{PA\ RF\ out}(t) = f(a_1(t), a_2(t)) \cdot \cos(2\pi f_c t + \theta(t) + \phi(a_1(t), a_2(t)) + \Psi_o) + z_{118}(t))$ from power amplification module 120 is an input measurement signal 128 provided to detection module 110. Detection module 110 linearizes or compensates RF output signal $S_{PA\ RF\ out}(t)$ for the AM/AM and AM/PM distortions to phase modulated signal $S_{PA\ RF\ in}(t)$ and baseband bias signal $S_{PA\ Baseband\ Bias\ in}(t)$ introduced into RF output signal $S_{PA\ RF\ out}(t)$ by power amplification module 120.

Phase modulated signal $S_{PA\ RF\ in}(t)$ exhibits a time varying phase and a time varying and substantially-known envelope. As previously discussed, detection module 110 compensates RF output signal $S_{PA\ RF\ out}(t)$ for non-linearity or distortion introduced by power amplification module 120.

In one embodiment, based on input reference signal 126 and input measurement signal 128, detection module 110 produces a first output signal 130, e.g., quadrature (Q') signal component, and a second output signal 132, e.g., in-phase (I') signal component.

First output signal 130 Q'(t) may be represented as follows:

$$Q'(t) = k_{Q'} \cdot a_2(t) \cdot f(a_1(t), a_2(t)) \cdot \sin[\phi(a_1(t), a_2(t))] + z_{Q'}(t)$$

where $k_{Q'}$ is a controllable gain, $a_2(t)$ is a time varying and substantially known RF input gain quantity for power amplification module 120, $f(a_1(t), a_2(t))$ is the AM/AM gain distortion of power amplification module 120, $\phi(a_1(t), a_2(t))$ is the AM/PM phase distortion of power amplification module 120, and $z_{Q'}(t)$ is a negligible small noise error quantity.

Second output signal 132 I'(t) may be represented as follows:

$$I'(t) = k_{I'} \cdot a_2(t) \cdot f(a_1(t), a_2(t)) \cdot \cos[\phi(a_1(t), a_2(t))] + z_{I'}(t)$$

where $k_{I'}$ is a controllable gain, $a_2(t)$ is a time varying and substantially known RF input gain quantity for the power amplification module 120, $f(a_1(t), a_2(t))$ is the AM/AM gain distortion of power amplification module 120, $\phi(a_1(t), a_2(t))$ is the AM/PM phase distortion of power amplification module 120, and $z_{I'}(t)$ is a negligible small noise error quantity. The variables $k_{Q'}$ and $k_{I'}$ are defined in further detail below.

In one embodiment, the first and second output signals 130, 132 may be provided to digital signal processing module 134. In one embodiment, a digital or analog envelope detector (not shown) may be provided after detection module 110 to determine the value for the product $a_2(t) \cdot f(a_1(t), a_2(t))$, for example. Digital signal processing module 134 may be used to calculate $f(a_1(t), a_2(t))$ in order to determine the distortion by dividing $a_2(t) \cdot f(a_1(t), a_2(t))$ by $a_2(t)$. The embodiments are not limited in this context.

As previously described, in one embodiment, detection module 110 produces first output signal 130 and second output signal 132. In one embodiment, first output signal 130 may be a quadrature (Q) signal component and second output signal 132 may be an in-phase (I) signal component. Variables $k_{Q'}$ and $k_{I'}$ may represent the internal gain paths of detection module 110. In one embodiment the internal gain paths of detection module may be implemented such that variables $k_{Q'}$ and $k_{I'}$ match wherein $k_{Q'} \approx k_{I'} = k$. For example, in some implementations variables $k_{Q'}$ and $k_{I'}$ may be matched to within 1 to 2 percent (1-2%), although in other implementations matching of variables $k_{Q'}$ and $k_{I'}$ may vary outside of this range. In one embodiment, the I and Q signal paths may be matched to achieve modulation fidelity without absolute calibration of variables $k_{Q'}$ and $k_{I'}$. In one embodiment, power control may be implemented in the same path as calibration and temperature compensation of variables $k_{Q'}$ and $k_{I'}$. The embodiments are not limited in this context.

As previously described, transmitter 100 may be selectively implemented as an IQ or a polar modulation transmitter architecture based on control input signal 107. Accordingly, in one embodiment, transmitter 100 may be implemented as a polar modulation transmitter architecture. In a polar modulation transmitter architecture implementation, the operation of transmitter 100 may be described in terms of the following variables:

$$k_{Q'} = k_{I'};$$
$$a_1(t) = a(t);$$
$$a_2(t) = \sum_{n=0}^{N-1} a_n \cdot U(t - nT);$$

and $$U(t) = \begin{cases} 1 & 0 \le t \le T \\ 0 & \text{Otherwise,} \end{cases}$$

where $a_1(t)$ may be a baseband modulation envelope signal, T is an arbitrary time duration that may be chosen based on specific implementations, and $a_2(t)$ acts as the transmit power control. $a_2(t)$ is a transmit power control input that is swept over possible power control levels by changing the value of $a_2(t)$ over time.

In one embodiment, transmitter 100 may be selected to operate in an IQ transmitter architecture. In an IQ transmitter architecture implementation, the operation of transmitter 100 may be described in terms of the following variables:

$$k_{Q'} = k_{I'};$$
$$a_2(t) = a(t);$$
$$a_1(t) = \sum_{n=0}^{N-1} a_n \cdot U(t - nT);$$

and $$U(t) = \begin{cases} 1 & 0 \le t \le T \\ 0 & \text{Otherwise,} \end{cases}$$

where $a_2(t)$ may be a baseband modulation envelope signal, T is an arbitrary time duration that may be chosen based on specific implementations, and $a_1(t)$ acts as the transmit power control. $a_1(t)$ may be considered a transmit power control input that is swept over possible power control levels by changing the value of $a_1(t)$ over time.

Figure 2:
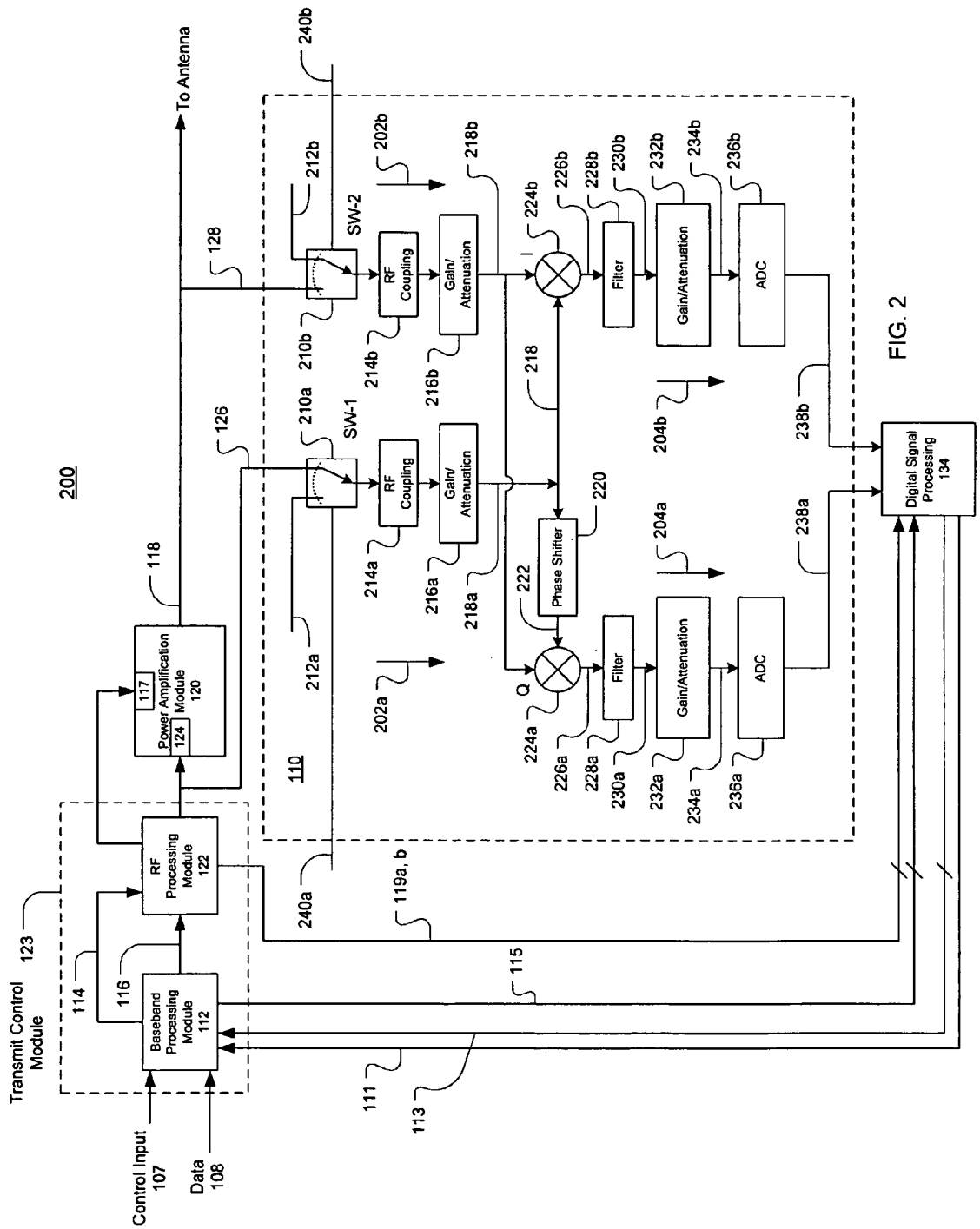
FIG. 2 illustrates one embodiment of a transmitter that includes one embodiment of a detection module.

FIG. 2 illustrates one embodiment of a transmitter that includes one embodiment of a detection module. Transmitter 200 comprises one embodiment of detection module 110. Detection module 110 comprises first and second input signal paths 202a, 202b and first and second output signal paths 204a, 204b. In one embodiment, detection module 110 may be operated continuously. In other embodiments, detection module 110 may be selectable and thus may be operated either continuously or intermittently. For example, detection module 110 may be selected or turned-on dynamically at certain predetermined times (e.g., during ramp up for Enhanced Data-rates for GSM Evolution or EDGE applications, where GSM is global system for mobile communications) and then deselected or turned-off at other predetermined times. For example, input reference signal 126 and input measurement signal 28 may be received by detection module 110 at certain predetermined times.

In one embodiment, prior to being applied to detection module 110, signals at input 124 (126) and output 118 (126) may be processed by any suitable variable gain attenuator/amplifier (not shown) to adjust the input power level to detection module 110. In one embodiment, a variable gain attenuator/amplifier may be implemented as a stepped attenuator/amplifier. In one embodiment, a fixed attenuator (not shown) may be provided between the output of power amplification module 120 and detection module 110 to limit the signal input into detection module 110 levels suitable to maintain reliability, for example. The embodiments are not limited in this context.

First switch 210a may be provided in first input signal path 202a. First switch 210a may comprise a first and second input terminal and an output terminal. Selected signals at the first and second terminals are provided to the output terminal. First switch 210a may be adapted to receive input reference signal 126 at the first input terminal, e.g., phase modulated signal $S_{PA\ RF\ in}(t)$ or baseband bias signal $S_{PA\ Baseband\ Bias\ in}(t)$ (based on the selected modulation architecture) at input 124 at the insertion point of power amplification module 120 in transmitter 200. Alternately, first switch 210a may receive input signal 212a at a second input terminal. For example, input signal 212a may be provided to first switch 210a from a Local Oscillator (LO) or any other suitable signal source. For example, a LO signal may be applied when detection module 110 is configured as an IQ demodulator. The selection of either input reference signal 126 or input signal 212a may be controlled by switch control signal 240a.

Second switch 210b may be provided in second input signal path 202b. Second switch 210b may comprise a first and second input terminal and an output terminal. Selected signals at the first and second terminals are provided to the output terminal. Second switch 210b may be adapted to receive input measurement signal 128 at a first input terminal, e.g., RF output signal from power amplification module 120. Alternately second switch 210b may receive input signal 212b at a second input terminal. For example, input signal 212b may be provided to second switch 210b from a LO or any other suitable signal source. Selection of input measurement signal 128 or input signal 212b may be controlled by switch control signal 240b. The signal selected by first switch 210a is mixed with the signal selected by second switch 210b. For example, in one embodiment, input reference signal 126 is mixed with input measurement signal 128. The embodiments are not limited in this context.

Detection module 110 may be selected and deselected based on switch control signals 240a, b. For example, detection module 110 may be selected to linearize RF output signal $S_{PA\ RF\ out}(t)$ by applying control signals 240a, b to switches 210a, b, respectively, to select input reference signal 126 and input measurement signal 128, respectively. Detection module 110 may be deselected by applying control signals 240a, b to switches 210a, b, respectively, to select input signals 240a, b, respectively. Input reference signal 126 and input measurement signal 128 may be received by detection module 110 at certain predetermined times. Other combinations of input signals may be used. For example, input signal 240a may be selected in conjunction with input measurement signal 128. And input signal 240b may be selected in conjunction with input reference signal 126.

In one embodiment, a LO may be implemented using Complementary Metal Oxide Semiconductor (CMOS) inverters (not shown). In one embodiment, the CMOS inverters may be configured to implement a ring-oscillator voltage controlled oscillator (VCO). In other embodiments, the LO may be implemented as a voltage controlled oscillator (VCO) operating at twice the input RF carrier frequency ($2 \cdot f_c$).

Signals in first input signal path 202a may be processed by one or more signal processors (e.g., coupled, amplified, attenuated, scaled, buffered, filtered, etc.) prior to mixing. As used herein a signal processor comprises analog and/or digital signal processing circuits including, but not limited to, couplers, amplifiers, attenuators, buffers, filters, and the like. For example, with reference to first input signal path 202a, the output of first switch 210a may be applied to RF coupling module 214a. The output of RF coupling module 214a may be applied to variable gain/attenuation module 216a. Output signal 218a of variable gain/attenuation module 216a may be applied to phase shifter 220 to produce signal 222. In one embodiment, signal 218a may be a phase shifted representation of signal 222. For example, in one embodiment, signal 222 is signal 218a shifted by 90°, e.g., signal 222 is the quadrature signal of output signal 218a. In one embodiment, quadrature signal 222 may be applied to the LO input of quadrature (Q) mixer 224a. Signal 218a may be applied to the LO input of in-phase (I) mixer 224b.

Signals in second input signal path 202b may be processed by one or more signal processors (e.g., coupled, amplified, attenuated, scaled, buffered, filtered, etc.) prior to mixing. As previously noted, a signal processor as used herein comprises analog and/or digital signal processing circuits including, but not limited to, couplers, amplifiers, attenuators, buffers, filters, and the like. With reference to second signal path 202b, the output of second switch 210b may be applied to RF coupling module 214b. The output of RF coupling module 214b may be applied to variable gain/attenuation module 216b. Output signal 218b of variable gain/attenuation module 216b may be applied to inputs of the Q-mixer 224a and I-mixer 224b. Output signal 218a component applied to Q-mixer 2214a and output signal 218b component applied to I-mixer 224b represent the phase difference and the amplitude difference, respectively, between input reference signal 126 and input measurement signal 128.

Output signals 218a, b may be buffered using, for example, CMOS inverters (not shown). Output signals 218a, b are provided to the LO inputs of respective Q and I mixers 224a, b. In one embodiment, output signals 218a, b signals 218a, b may correspond to phase modulated output signals provided by a phase modulator portion of RF processing module 122. In one embodiment, RF processing module 122 may comprise a VCO operating at twice the RF carrier signal frequency, i.e., $2 \cdot f_c$, followed by a divide-by-two (e.g., /2) quadrature divider. Accordingly, the in-phase and quadrature LO frequencies are inherently generated and an explicit phase sifter is not required. In other embodiments, the modulated LO signal 218a may be phase shifted by 90° by phase shifter 220 to produce signal 222. Modulated quadrature (Q) LO signal may be mixed with output signal 218b to produce a time varying quadrature (Q) output signal 226a component defined by the following relationship:

$$Q(t) = k_Q \cdot a_2(t) \cdot f(a_1(t), a_2(t)) \cdot \sin[\phi(a_1(t), a_2(t))] + z_Q(t)$$

where $k_Q$ is a controllable gain, $a_2(t)$ is a time varying and substantially known RF input gain quantity for power amplification module 120, $f(a_1(t), a_2(t))$ is the AM/AM gain distortion of power amplification module 120, $\phi(a_1(t), a_2(t))$ is the AM/PM phase distortion of power amplification module 120, and $z_Q(t)$ is a negligibly small noise error quantity.

Modulated in-phase (I) LO signals 218a, b may be mixed to produce an in-phase (I) output signal 226b component by the following relationship:

$$I(t) = k_I \cdot a_2(t) \cdot f(a_1(t), a_2(t)) \cdot \cos[\phi(a_1(t), a_2(t))] + z_1(t)$$

where $k_I$ is a controllable gain, $a_2(t)$ is a time varying and substantially known RF input gain quantity for the power amplification module 120, $f(a_1(t), a_2(t))$ is the AM/AM gain distortion of power amplification module 120, $\phi(a_1(t), a_2(t))$ is the AM/PM phase distortion of power amplification module 120, and $z_1(t)$ is a negligibly small noise error quantity.

Q(t) and I(t) signal components of respective output signals 226a, b components represent received quantities, where, as previously discussed, $a_2(t) \cdot f(a_1(t), a_2(t))$ is the time-varying amplitude envelope measured at output 118 of power amplification module 120 and $\phi(a_1(t), a_2(t))$ is the time-varying phase difference between the phase of the signal measured at input 124 of power amplification module 120 and the phase of the signal measured at output 118 of power amplification module 120. Variables $k_Q$ and $k_I$ may represent internal gain paths corresponding to first and second input signal paths 202a, b of detection module 110. In one embodiment, internal gain paths corresponding to first and second signal paths 202a, b may be implemented such that variables $k_Q$, $k_I$ match, e.g., $k_Q \approx k_I = k$, for example. For example, in one embodiment, variables $k_Q$, $k_I$ may be matched to between 1 to 2 percent (1-2%), although in other embodiments matching of variables $k_Q$, $k_I$ may vary. And, in further embodiments, variables $k_Q$, $k_I$ may not match. In one embodiment, Q and I signal paths corresponding to first and second input signal paths 202a, b may be matched such that modulation fidelity may be achieved without absolute calibration of the variables $k_Q$, $k_I$, for example. In one embodiment, power control may be implemented in paths 202a, b in conjunction with calibration and temperature compensation of variables $k_Q$, $k_I$. The embodiments are not limited in this context.

Variable gain/attenuation modules 216a, b may be adapted to operate in conjunction with baseband gain control modules (e.g., modules 232a, b in corresponding output signal paths 204a, b) to limit the maximum signal level provided to Q and I mixers 224a, b and to limit the dynamic range required by ADCs 236a, b, in output signal paths 204a, b. Variable attenuators 216a, b may be adapted to limit the signal levels provided to Q and I mixers 224a, b and may be adapted to provide gain control, among other functionality, for example. Attenuators 224a, b may be implemented as passive attenuators, active gain control modules, and/or any combinations thereof depending on the particular implementation.

In one embodiment, Q and I mixers 224a, b may be implemented as balanced passive switching mixers. Balanced mixers of this type do not require DC power and have a large dynamic range. Either Q-mixer 224a output signal 226a component or I-mixer 224b output signal 226b component, or both, may be dynamically selectable by controlling the state of respective first and second switches 210a and 210b with respective switch control signals 240a and 240b.

Signals in first output signal path 204a may be processed after mixing (e.g., coupled, amplified, attenuated, scaled, buffered, filtered, etc.). Output signal 226a component of Q-mixer 224a may be applied to one or more filters. In one embodiment, the filters may comprise digital-filtering/spectral-shaping modules. In one embodiment, filter 228a may be a low-pass filter (LPF) and may be adapted with tunable bandwidth (BW) and gain to accommodate various modulation characteristics, for example. In one embodiment filter 228a may be first order filters adapted to attenuate LO and radio frequencies in the gigahertz (GHz) frequency band. In one embodiment, LPF 228a may be implemented as metal-insulator-metal (MIM) capacitors in conjunction with internal switch resistances. In one embodiment output signal 226a component of Q-mixer 224a may be applied to filter 228a. Filtered output signal 230a may be applied to gain/attenuation module 232a. In one embodiment, gain/attenuation module 232a may be adapted to provide variable DC-offset to signal 230a. It will be appreciated by those skilled in the art that DC-offset may take place at any suitable point along signal paths 202a, b and/or 204a, b, depending on the particular mode of operation or implementation. Gain/attenuation module 232a, including variable DC-offset, may be implemented using a variety of techniques. In one embodiment a gain control function of module 232a may be implemented as a passive amplifier/attenuator, e.g., stepped amplification/attenuation, or as an active amplifier/attenuator, e.g., stepped amplification/attenuation as a feedback network of an amplifier, and/or any combination thereof. DC-offset adjustments may or may not be required based on the implementation. For example, DC-offset may not be required in passive implementations, whereas DC-offset may be required in active implementations depending on the signal gain in output signal path 204a and the dynamic range of ADC 236a. Thus, signals in first input path 202a and first output path 204a may be amplified before and after Q-mixer 224a. Signal 234a may be applied to ADC 236a. As previously discussed, signal 234a may include a DC-offset and/or may be amplified/attenuated based on the actual implementation or configuration of detection module 110. In one embodiment, ADC 236a may comprise variable dynamic-range, sampling-rate, and bit-width resolutions, variable sampling/clock rates and tunable dynamic range, for example. Output 238a of ADC 236a may be applied to digital signal processing module 134.

Signals in second output signal path 204b may be processed after mixing (e.g., coupled, amplified, attenuated, scaled, buffered, filtered, etc.). Output signal 226b component of I-mixer 224b may be applied to one or more filters. In one embodiment, the filters may comprise digital-filtering/spectral-shaping modules. In one embodiment, output signal 226b component of I-mixer 224b is applied to filter 228b. In one embodiment, filter 228b may be a LPF and may be adapted with tunable BW and gain to accommodate various modulation characteristics, for example. In one embodiment filter 228b may be first order filters adapted to attenuate LO and radio frequencies in the GHz frequency band. In one embodiment, LPF 228b may be implemented as MIM capacitors in conjunction with internal switch resistances. In one embodiment output signal 226b component of I-mixer 224b may be applied to filter 228b. Filtered output signal 230b may be applied to variable gain/attenuation module 232b. In one embodiment, gain/attenuation module 232b may be adapted to provide variable DC-offset to signal 230b. Gain/attenuation module 232b, including variable DC-offset, may be implemented using a variety of techniques. In one embodiment a gain control function of module 232b may be implemented using a variety of techniques. In one embodiment a gain control function of module 232b may be implemented as a passive amplifier/attenuator, e.g., stepped amplification/attenuation, or as an active amplifier/attenuator, e.g., stepped amplification/attenuation in a feedback network of an amplifier, and/or any combination thereof. DC offset adjustments may or may not be required based on the implementation. For example, DC-offset may not be required in passive implementations, whereas DC-offset may be required in active implementations depending on the signal gain in output signal path 204a and the dynamic range of ADC 236b. Thus, signals in second input path 202b and second output path 204b may be amplified before and after I-mixer 224b. Signal 234b may be applied to ADC 236b. As previously discussed, signal 234b may include a DC-offset and/or may be amplified/attenuated based on the actual implementation or configuration of detection module 110. In one embodiment, ADC 236b may comprise variable dynamic-range, sampling-rate, and bit-width resolutions, variable sampling/clock rates and tunable dynamic range, for example. Output 238b of ADC 236b may be applied to digital signal processing module 134.

In various embodiments, ADCs 236a, b may be implemented in a variety of techniques based on different criteria and implementations of transmitter 100. For example, ADC 236a may be adapted to improve the overall transmitter 100 performance and/or to lower the power consumption of transmitter 100, or any combination thereof. The dynamic range of ADCs 236a, b also may vary as a function of protocol and configuration of gain control, for example.

From digital signal processing module 134, or within module 134, the collected non-linearity data (i.e., the AM/PM information) may be applied to a direct look-up-table (LUT) or to generate a computational routine such as polynomial approximation, for example. Power control may be implemented with a microprocessor, e.g., digital signal processing module 134, to calculate the amplitude of the measurement signal by taking the square root of the sum of the squares of I and Q signals.

In one embodiment, a synchronous detector comprising a PLL may be used to extract the carrier signal and to produce an I-only signal that represents the amplitude of $S_{PA\ RF\ out}(t)$ at output 118 of power amplification module 120.

Operations for the above system and subsystem may be further described with reference to the following figures and accompanying examples. Some of the figures may include programming logic. Although such figures presented herein may include a particular programming logic, it can be appreciated that the programming logic merely provides an example of how the general functionality described herein can be implemented. Further, the given programming logic does not necessarily have to be executed in the order presented unless otherwise indicated. In addition, the given programming logic may be implemented by a hardware element, a software element executed by a processor, or any combination thereof. The embodiments are not limited in this context.

Figure 3:
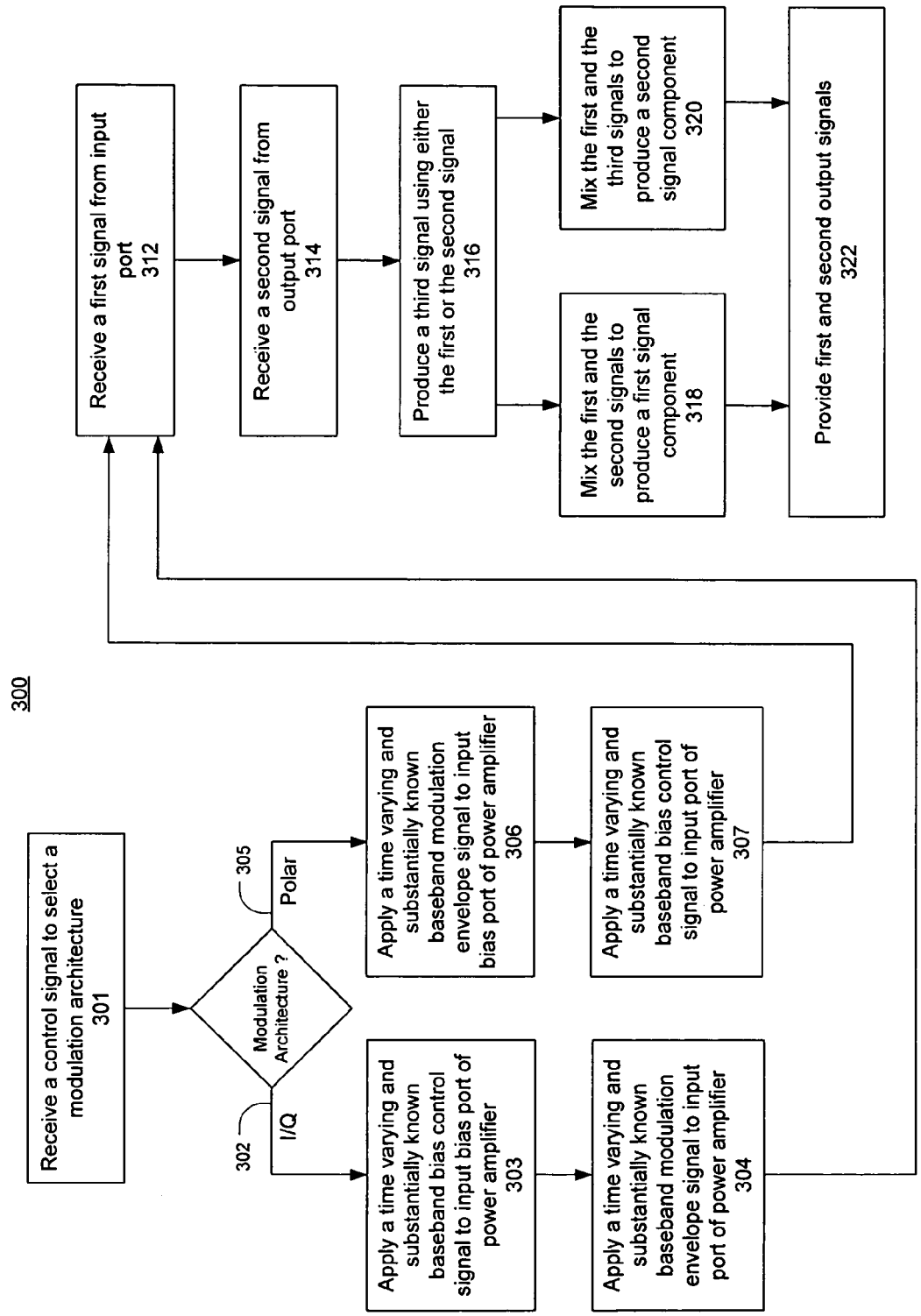
FIG. 3 illustrates one embodiment of a logic flow diagram.

FIG. 3 illustrates one embodiment of a logic flow diagram. Logic flow diagram 300 may be representative of the operations executed in one or more systems described herein. For example, in one embodiment baseband processing module 112 receives (301) a control input signal to select a modulation architecture. When a first modulation architecture (e.g., IQ or in-phase, quadrature) is selected (302) based on the control input signal, RF processing module 122 applies (303) a time varying and substantially known baseband bias control signal to bias input 117 of power amplification module 120 and applies (304) a time varying and substantially known baseband modulation envelope signal to input 124 of power amplification module 120. When a second modulation architecture (e.g., polar or phase, magnitude) is selected (305) based on the control input signal, RF processing module 122 applies (306) the time varying and substantially known baseband modulation envelope signal to bias input 117 of power amplification module and applies (307) the time varying and substantially known baseband bias control signal to input 124 of power amplification module 120.

In one embodiment detection module 110 receives (312) an input reference signal 126 from input 124 of power amplification module 120 and receives (314) an input measurement signal 128 from output 118 of power amplification module 120. Input measurement signal 128 may exhibit a varying phase. In one embodiment, input reference signal 126 may comprise a varying and substantially known envelope. Input reference signal 126 and input measurement signal 128 may be received at predetermined times. Input reference signal 126 or fourth signal 240a may be selected using first switch 210a. Input measurement signal 128 or fifth signal 240b may be selected second switch 212b. Input reference signal 126 and input measurement signal 128 and/or fourth and fifth signals 240a, b may be received from amplifier 120, modulator or local oscillator portions of RF processing module 122 or other signal generator.

Either one of the first and second signals may be used to produce (316) a third signal 222. In one embodiment, either one of input reference signal 126 and input measurement signal 128 may be phase shifted by substantially ninety degrees (90°) to produce third signal 222. In other embodiments, phase shifter 220 may be used to phase shift either one of input reference signal 126 and input measurement signal 128 to produce third signal 222. Input reference signal 126 and input measurement signal 128 may be mixed (318) to produce a first signal component 226b. In one embodiment, mixing input reference signal 126 and input measurement signal 128 produces an in-phase first signal component 226b. Input reference signal 126 and third signal 222 may be mixed (320) to produce a second signal component 226a. Prior to mixing input reference signal 126 may be processed by RF coupling module 214a and/or gain/attenuation module 216a. Similarly, prior to mixing input measurement signal 128 may be processed by RF coupling module 214b and/or gain/attenuation module 216b. In one embodiment, mixing input reference signal 126 and third signal 222 produces a quadrature second signal component 226a. Either one of first and second signal components 226b, a represents a phase and an amplitude difference between input reference signal 126 and second input measurement signal 128. After mixing first signal component 228a may be processed by filter 228a, and/or gain/attenuation module 232a and/or ADC 236a. Similarly, after mixing second signal component 228b may be processed by filter 228b, and/or gain/attenuation module 232b and/or ADC 236b.

First and second output signals 238a, b may be provided (322) at an output portion of detection module 110. First and second output signals 238a, b comprise non-linearity information associated with input measurement signal 128 to compensate input measurement signal 128 for distortion.

The techniques and embodiments of transmitters 100 and 200 discussed herein may be combined with suitable analog and/or digital circuits to obtain modulation across multiple modulation techniques. These modulation techniques may include, for example, Gaussian Mean Shift Keying (GMSK) used in GSM, Gaussian Frequency Shift Keying (GFSK) used in Digital European Cordless Telecommunications (DECT) and Bluetooth, Phase Shift Keying with eight states allowing for coding using 8-bit combinations (8-PSK) used in EDGE, Offset Quadrature Phase Shift Keying (OQPSK) and Hybrid Phase-Shift Keying (HPSK) used in IS-2000, π/4 Differential Quadrature Phase-Shift Keying (DQPSK) used in Time Division Multiple Access (TDMA) and Orthogonal Frequency Division Modulation (OFDM) used in 802.11 and the like, among others. The embodiments are not limited in this context.

In one embodiment, transmitters discussed herein may be specialized for particular applications. Nevertheless, combinations of applications may be desired in particular embodiments. Applications may include, but are not limited to, Code Division Multiple Access (CDMA), CDMA-2000, Wideband Code Division Multiple Access (W-CDMA), GSM, TDMA, among other types of devices both wired and wireless, e.g., Bluetooth, 802.11a, b, g, Global Positioning System (GPS), radar, Single Carrier (1×) Radio Transmission Technology (1×RTT), radios, General Packet Radio Service (GPRS), computers and computer communication devices, handheld devices and the like, among others. The embodiments are not limited in this context.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

It is also worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Some embodiments may be implemented using an architecture that may vary in accordance with any number of factors, such as desired speed, power levels, heat tolerances, semiconductor manufacturing processing, input rates, output rates, memory resources, and other performance constraints.

Some embodiments may be described using the expression "coupled" along with their derivatives. It should be understood that the term "coupled" may be used to indicate that two or more elements are in direct physical or electrical contact. The term "coupled," however, also may mean that two or more elements are not in direct contact with each other, but yet still co-operate or interact with each other. The embodiments are not limited in this context.

While certain features of the embodiments have been illustrated as described herein, many modifications, substitutions, changes and equivalents will now occur to those skilled in the art. It is therefore to be understood that the appended claims are intended to cover all such modifications and changes as fall within the true spirit of the embodiments.

The invention claimed is:

1. A method for selecting a modulation architecture, comprising:

receiving a control input signal to select a modulation architecture;

when a first modulation architecture is selected based on said control input signal:

applying a time varying and substantially known baseband bias control signal to a bias input of a power amplification module; and applying a time varying and substantially known baseband modulation envelope signal to an input of said power amplification module; and when a second modulation architecture is selected based on said control input signal:

applying said time varying and substantially known baseband modulation envelope signal to said bias input of said power amplification module;

applying said time varying and substantially known baseband bias control signal to said input of said power amplification module;

receiving a first signal from said input of said power amplification module;

receiving a second signal from an output of said power amplification module;

producing a third signal using either one of said first and second signals;

mixing said first and said second signals to produce a first signal component;

mixing said first and said third signal to produce a second signal component;

wherein either one of said first and second signal components represents a phase and an amplitude difference between said first and second signals;

selecting either said first signal or a fourth signal using a first switch; and selecting either said second signal or a fifth signal using a second switch.

2. The method of claim 1, comprising:

phase shifting either one of said first and second signals by substantially ninety degrees (90°) to produce said third signal;

mixing said first and said second signals to produce an in-phase first signal component;

mixing said first and said third signal to produce a quadrature second signal component.

3. The method of claim 1, comprising receiving said first and second signals at predetermined times.

4. The method of claim 1, comprising producing first and second output signals comprising distortion information associated with said second input signal to compensate said second input signal for said distortion.

5. The method of claim 1, comprising receiving said first signal or said second signal from any one of an amplifier, modulator, local oscillator, and other signal generator.

6. The method of claim 1, comprising processing said first signal and said second signal prior to mixing.

7. The method of claim 1, comprising processing said first component and said second signal component.

8. An apparatus to select a modulation architecture, comprising:

a baseband processing module to receive a control input signal to select a modulation architecture; and a radio frequency (RF) processing module to apply a time varying and substantially known baseband bias control signal to a bias input of a power amplification module and to apply a time varying and substantially known baseband modulation envelope signal to an input of said power amplification module when a first modulation architecture is selected based on said control input signal;

said RF processing module to apply said time varying and substantially known baseband modulation envelope signal to said bias input of said power amplification module and to apply said time varying and substantially known baseband bias control signal to said input of said power amplification module when a second modulation architecture is selected based on said control input signal;

a first input to receive a first signal from said input of said power amplification module, said first signal exhibiting a varying phase and a varying and substantially known envelope;

a second input to receive a second signal from an output of said power amplification module;

a first mixer coupled to said first and second inputs to mix said first and said second signals and to produce a first signal component;

a second mixer coupled to said second input and a third signal to mix said first and said third signal to produce a second signal component;

wherein either one of said first and second signal components represents a phase and an amplitude difference between said first and second signals;

a first switch having a first and second input terminal to select either said first signal coupled to said first input terminal or a fourth signal coupled to said second input terminal, said selected signal coupled to a first output terminal of said first switch; and a second switch having a third and fourth input terminal to select either said second signal coupled to said third input terminal or a fifth signal coupled to said fourth input terminal, said selected signal coupled to a second output terminal of said second switch.

9. The apparatus of claim 8, comprising a phase shifter coupled to either one of said first and second signal to phase shift either one of said first and second signals;

wherein said phase shifter is to phase shift either one of said first and second signals by substantially ninety degrees (90°) to produce said third signal.

10. The apparatus of claim 8, comprising:

a first signal processor coupled to said first output terminal of said first switch and coupled to said first mixer; and a second signal processor coupled to said second output terminal of said second switch and coupled to said mixer;

wherein any one of said first and second signal processor module is to couple, amplify or attenuate either one of said first and second signals.

11. The apparatus of claim 8, comprising:

a third signal processor coupled to said first mixer to process said first signal component; and a fourth signal processor coupled to said second mixer to process said second signal component;

wherein any one of said third and fourth signal processor is to couple, amplify or attenuate either one of said first and second signal components.

12. The apparatus of claim 8, comprising a first and second output to provide first and second output signals comprising distortion information associated with said second input signal to compensate said second input signal for said distortion.

13. A system to select a modulation architecture, comprising:

an amplifier comprising a bias input, an input, and an output; and a detection module comprising:

a first input coupled to said input of said amplifier to receive a first signal, said first signal exhibiting a time varying and substantially known baseband modulation envelope signal when a first modulation architecture is selected based on a control input signal and said first signal exhibiting time varying and substantially known baseband bias control signal when a second modulation architecture is selected based on said control input signal;

a second input coupled to said output of said amplifier to receive a second signal;

a first mixer coupled to said first and second inputs of said detection module to mix said first and said second signals and to produce a first signal component;

a second mixer coupled to said second input of said detection module to mix said first signal and a third signal and to produce a second signal component;

a first switch having a first and second input terminal to select either said first signal coupled to said first input terminal or a fourth signal coupled to said second input terminal, said selected signal coupled to a first output terminal of said first switch; and a second switch having a third and fourth input terminal to select either said second signal coupled to said third input terminal or a fifth signal coupled to said fourth input terminal, said selected signal coupled to a second output terminal of said second switch;

wherein either one of said first and second signal components represents a phase and an amplitude difference between said first and second signals.

14. The system of claim 13, comprising a phase shifter coupled to either one of said first and second signal to phase shift either one of said first and second signals;

wherein said phase shifter is to phase shift either one of said first and second signals by substantially ninety degrees (90°) to produce said third signal.

15. The system of claim 13, wherein said detection module comprises:

a first signal processor coupled to said first output terminal of said first switch and coupled to said first mixer; and a second signal processor coupled to said second output terminal of said second switch and coupled to said mixer;

wherein any one of said first and second signal processor module is to couple, amplify or attenuate either one of said first and second signals.

16. The system of claim 13, wherein said detection module comprises:

a third signal processor coupled to said first mixer to process said first signal component; and a fourth signal processor coupled to said second mixer to process said second signal component;

wherein any one of said third and fourth signal processor is to couple, amplify or attenuate either one of said first and second signal components.

17. The system of claim 13, wherein said detection module comprises a first and second output to provide first and second output signals comprising distortion information associated with said second input signal to compensate said second input signal for said distortion.

* * * * *